United States Patent [19]
Saga et al.

[11] 4,430,732
[45] Feb. 7, 1984

[54] SWITCH MATRIX APPARATUS FOR SATELLITE-SWITCHED TDMA SYSTEM OR THE LIKE

[75] Inventors: Ryokichi Saga; Yukio Takimoto, both of Tokyo, Japan

[73] Assignee: Nippon Electric Co., Ltd., Tokyo, Japan

[21] Appl. No.: 226,793

[22] Filed: Jan. 21, 1981

[30] Foreign Application Priority Data

Jan. 23, 1980 [JP] Japan .................................. 55-6465

[51] Int. Cl.³ .................. H04J 15/00; H04B 7/185
[52] U.S. Cl. ............................. 370/54; 370/112; 455/12; 330/295
[58] Field of Search .............. 179/18 FA, 18 GF; 340/825.03; 455/49, 52, 12, 13, 137; 370/53, 54, 58, 66, 56, 112; 330/51, 295, 296, 124, 311; 333/100, 101, 103; 328/152, 153, 154

[56] References Cited

U.S. PATENT DOCUMENTS

| | | | |
|---|---|---|---|
| 2,992,410 | 7/1961 | Groth et al. | 179/18 GF |
| 3,061,685 | 10/1962 | Peach | 370/54 |
| 3,332,038 | 7/1967 | Stanley et al. | 455/137 |
| 3,452,356 | 6/1969 | Stoney | 455/12 |
| 3,542,958 | 11/1970 | Brightman | 179/18 GF |
| 3,783,307 | 1/1974 | Breuer | 328/154 |
| 3,833,866 | 9/1974 | Boutelant | 333/103 |
| 4,354,266 | 10/1982 | Cooperman | 370/112 |

OTHER PUBLICATIONS

Baseline Considerations of Beam Switched SS-TDMA Satellites Using Baseband Matrix Switching, by: C. Louis Cuccia, Richard S. Davies, E. Wesley Matthews-Ford Aerospace and Communications Corporation, pp. 6.3-126 through 6.3-131, *IEEE International Conference on Communications*, Published in Jun. 1977.

*Primary Examiner*—Benedict V. Safourek
*Attorney, Agent, or Firm*—Laff, Whitesel, Conte & Saret

[57] ABSTRACT

A switching matrix enables the impedance to be easily matched at the connecting points of the distributing, the switching and the combining circuits, and of the external circuits. The switching circuit used by the switch matrix, includes PIN diodes, Schottky barrier diodes, field-effect-transistors (FETS), coaxial relays, or mixers. These devices can gain the ON/OFF ratio required for the switching circuit. However, in an M×N switch matrix, the input impedance of the switch circuit is usually dependent on the number of inputs or outputs to be selected, and therefore, there are deviations in the ON/OFF ratio required for the switch operations and a resulting deterioration in the signal-to-noise ratio. The present invention provides a switch matrix which is flexible enough to allow easy changes of the number of input/output terminals, with only a small insertion loss, even with a great number of input/output terminals. The switch matrix has a greater ON/OFF ratio, by cascade-connecting the switch circuits in multiple stages, with a smaller output level of deviation which is caused by the routing differences for signals. The switch matrix has a high switching speed, small size, light weight, and low power consumption.

16 Claims, 8 Drawing Figures

SWITCH MATRIX APPARATUS FOR SATELLITE-SWITCHED TDMA SYSTEM OR THE LIKE

The present invention relates to a switch matrix and associated apparatus used for satellite-switched time-division-multiple-access (SS-TDMA) system, etc.

The SS-TDMA system for which a switch matrix is used, for example, employs a satellite which has a plurality of spot beams covering a plurality of specific service areas, to carry out communications among earth stations placed in the service areas. A TDMA signal is transmitted from an earth station in an area covered by a beam and is combined with a TDMA signal of the same or another beam covering the earth station with communication being completed by a time division switch carried on the satellite. For this purpose, an M×N switch matrix (M and N are positive integers, and preferably M=N) is used as the time division switch.

There are occasions when one station transmits identical information to a plurality of stations (dispatching communication) and when a plurality of stations transmit identical or different information to one station (centralizing communication). In order to carry out such communications with a switch matrix carried on the satellite, an M×N switch matrix is required to have a dispatching connection function to distribute 1 input to L outputs (L is a positive integer and L≦N), a centralizing connection function combines and connects P inputs (P is a positive integer and P≧M) to 1 output. For such a connection an M×N switch matrix needs a circuit to distribute respectively M inputs to N outputs, and a circuit which turns these N outputs on/off by a switching circuit and takes out the desired outputs for combination.

There is known in the conventional art a composition using a hybrid, a resistance or a coupler as a distributing/combining circuit to be used with such a switch matrix. If a hybrid or a coupler is used, there is an accompanying insertion loss of more than 3 dB respectively for two distributions/combinations, and similarly an insertion loss of 6 dB if a resistance is used. Accordingly, the bigger the scope of the switch matrix is, (i.e., if M and N are increased), the larger the insertion loss increase becomes. Thus, it becomes impractical.

Variations in the insertion loss caused by such numbers of distribution and combination will hamper the flexibility of the switch matrix. The distribution/combining circuit comprising a resistance, a hybrid and a coupler needs to constantly have its input and output impedance matched. However, with a conventional circuit construction, the impedance is constant, irrespective of the switch circuit's ON/OFF status, and the structure becomes necessarily complex. If the operational frequency region for the hybrid or the coupler becomes low, the size of the switch matrix becomes larger and it becomes inconvenient for a SS-TDMA system to perform regenerative repeating.

As a switching circuit to be used for the switch matrix, there are PIN diodes, Schottky barrier diodes, field-effect-transistors (FETS), coaxial relays, or mixers. These devices can gain the ON/OFF ratio required for the switching circuit, depending on the impedance differences between the ON/OFF states of these devices. In the M×N switch matrix, however, the input impedance of the switch circuit is usually dependent on the number of inputs or outputs to be selected, and therefore causes deviations in the ON/OFF ratio required for the switch operations. Accordingly, there is a deterioration in the signal-to-noise ratio of the output. As discussed before, the structure of the conventional type of switching circuit, where the input impedance becomes constant is quite complex.

An object of the present invention, accordingly is to provide a switch matrix apparatus where the impedance is easily matched at the connecting points of the distributing, the switching and the combining circuits, and of the external circuits.

Another object of the present invention is to provide a switch matrix and associated apparatus which is flexible enough to allow easy changes of the number of input/output terminals.

Still another object of the present invention is to provide a switch matrix with a small insertion loss even with a great number of input/output terminals.

Yet other object of the present invention is to provide a switch matrix with a greater ON/OFF ratio by cascade-connecting the switch circuits in multiple stages.

Another object of the present invention is to provide a switch matrix with a smaller output level deviation which is caused by the routing differences for signals.

Still another object of the present invention is to provide a switch matrix with a high switching speed, small size, light weight, and low power consumption.

According to the present invention, a switch matrix has: M (M is a positive integer) distributing means for distributing an input signal applied thereto into N outlet signals (N is a positive integer). There are N combining means for combining the respective distributing outputs of the M distributing means to a signal, respectively. The N combining means respectively include a current combining means using resistances and a low input impedance circuit to be connected to the output of the current combining means. The M×N switching circuit is connected respectively between the outputs of the M distributing means and the inputs of the N combining means. The M×N switching circuit means respectively have a switch means with a high input impedance and a low output impedance.

Features and advantages of the present invention will be described in detail referring to the accompanying drawings wherein.

Figure 1:
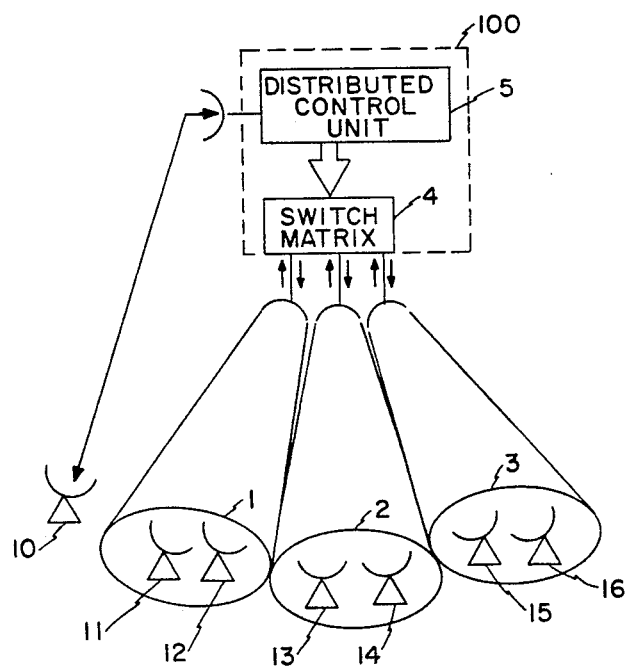
FIG. 1 is a schematic diagram of the SS-TDMA system.

In FIG. 1, each of the earth stations 11 to 16 is in communication with a satellite transponder 100 by way of the up-beams and the down-beams. When a TDMA signal is sent from the earth station 11 of service area 1 toward the satellite, and includes bursts intended for another station within the same area 1, a switch matrix 4 within the transponder 100, which received the bursts, completes a path to couple the up-beam with the down-beam for the area 1. When a TDMA signal from the earth station 11 includes bursts intended for a station in a service area 2 or 3, the switch matrix 4, which received the bursts, completes a path to couple the up-beam for the area 1 with a down-beam for the area 2 or the area 3. When one of the earth stations 11 to 16 sends a signal to a plurality of other stations to perform a dispatching connection, and when a plurality of stations sends out signals to one station to perform a centralizing connection, beams to be respectively coupled are similarly switched via the switch matrix 4. The switch matrix apparatus 4 is controlled by a distribution control unit (DCU) 5 which operates responsive to commands from a control base station 10.

Figure 2:
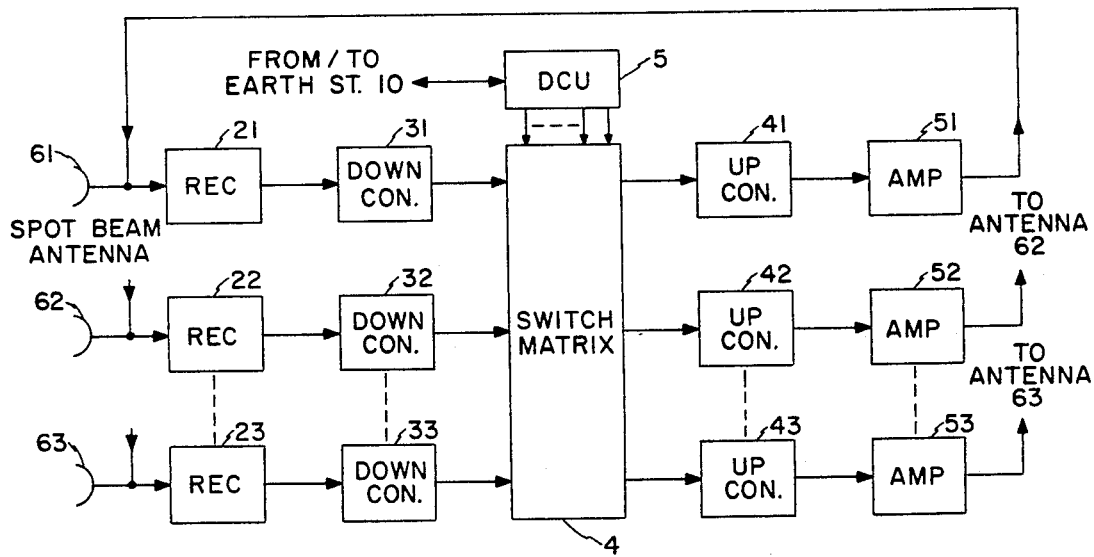
FIG. 2 is a block diagram for the transponder carried on the satellite of the SS-TDMA system shown in FIG. 1.

FIG. 2 schematically illustrates the transponder 100. A ratio frequency (RF) signal received at a receiver 21, via a spot-beam antenna 61, is converted into an intermediate frequency (IF) signal at a frequency converter 31, and then applied to the switch matrix 4. The IF signal is applied to the routes corresponding to the destination stations, by the switch matrix apparatus 4. Then, it is again converted into a radio frequency signal at, for example, a frequency converter 42 to be sent out from a spot-beam antenna 62 having been amplified at a power amplifier 52. Signals to be applied to the other antennas 62-63 are also sent from the antenna covering the area where destination stations are respectively located. The switch matrix apparatus 4 selects the various routes. The DCU 5 controlling the switch matrix 4 operates upon a command signal from a separate earth station 10 (FIG. 1) which is in command. However, it is also possible to eliminate a need for the earth station 10 which acts exclusively for issuing the command signal, by including the command signal in the communication signals which are transmitted from other stations 11 to 16.

An example of the SS-TDMA system shown in FIGS. 1 and 2 is disclosed in a paper entitled "Baseline Considerations of Beam Switched SS-TDMA Satellites Using Baseband Matrix Switching" by C. Louis Cuccia et al in *IEEE International Conference on Communications*, pp. 6.3-126, 6.3-131, published in June 1977. Although the switch matrix 4 shown in FIG. 2 couples the up-beam with the down-beam in the IF region, it should be noted that they may be coupled either in the RF region or the baseband region. In the foregoing explanation, we explained a TDMA system using the satellite switching, but the above mentioned switch matrix may be adapted in a similar way to an FDMA system using the satellite switching.

Figure 3:
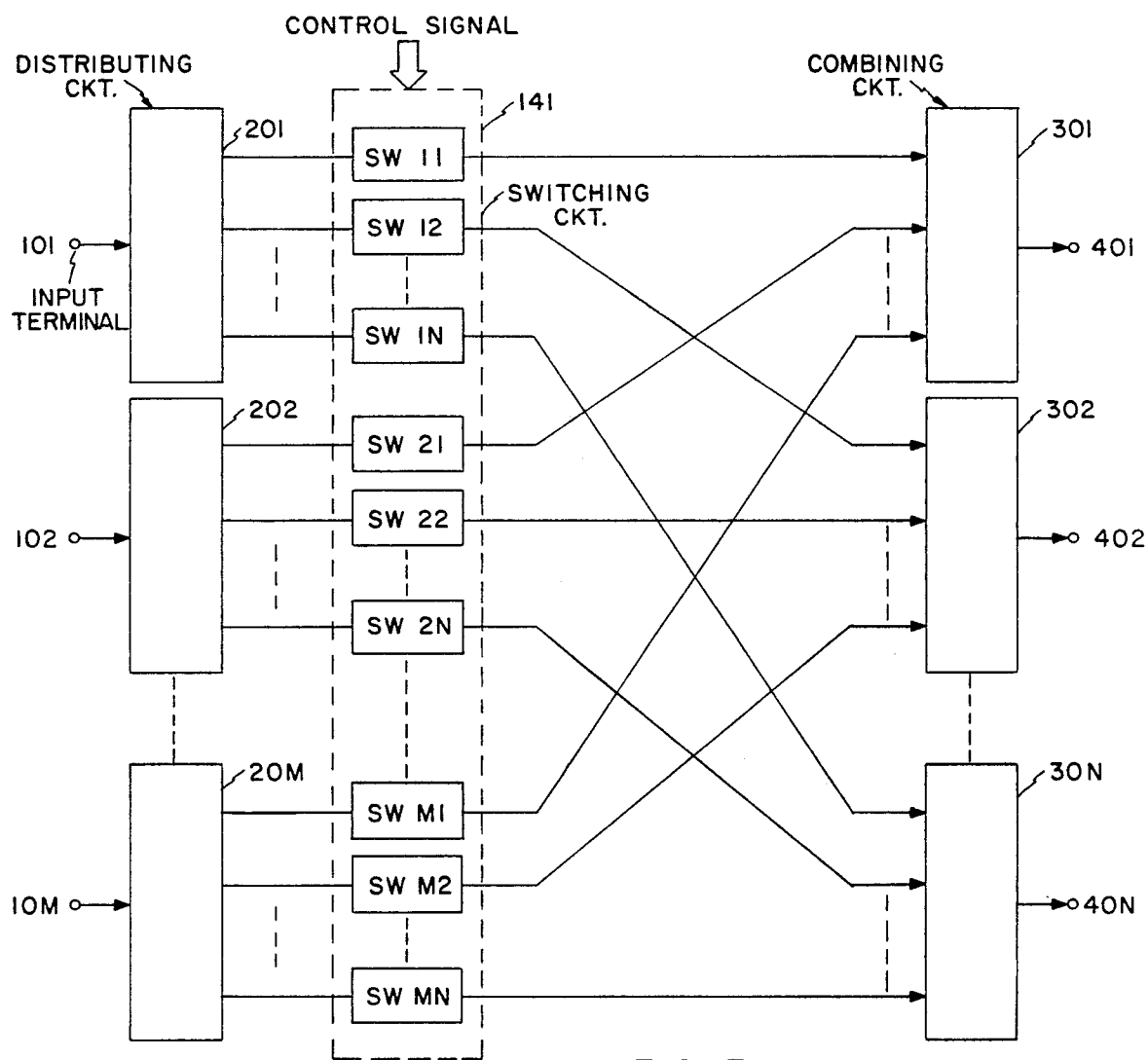
FIG. 3 is a block diagram showing the M×N switch matrix in accordance with the present invention.

In FIG. 3, the apparatus is a cross-bar type of M×N switch matrix, concerning the present invention. Although the numbers of the input M and the output N are arbitrarily selected, they may preferably be equal. The input signal supplied to an input terminal 101 is distributed to the N number of signals at a distributing circuit 201. The routes for the distributed signals are selected so that they will be supplied to only the destination stations by switches 11-1N within a switching circuit 141. The signals selected by the switches 11-1N are supplied to one of the combining circuits 301-30N which combines the selected signals with signals of the other routes selected at the switching circuit 141 and then applies the combined signal at their output terminals 40-40N, respectively. The input signal supplied to other input terminals 102-10M is similarly processed. By ON/OFF controlling the switches 11-1N-M1-MN independently in the switching circuit 141, it is possible to set the arbitrary connection mode for the M×N switch matrix.

Figures 4, 5:
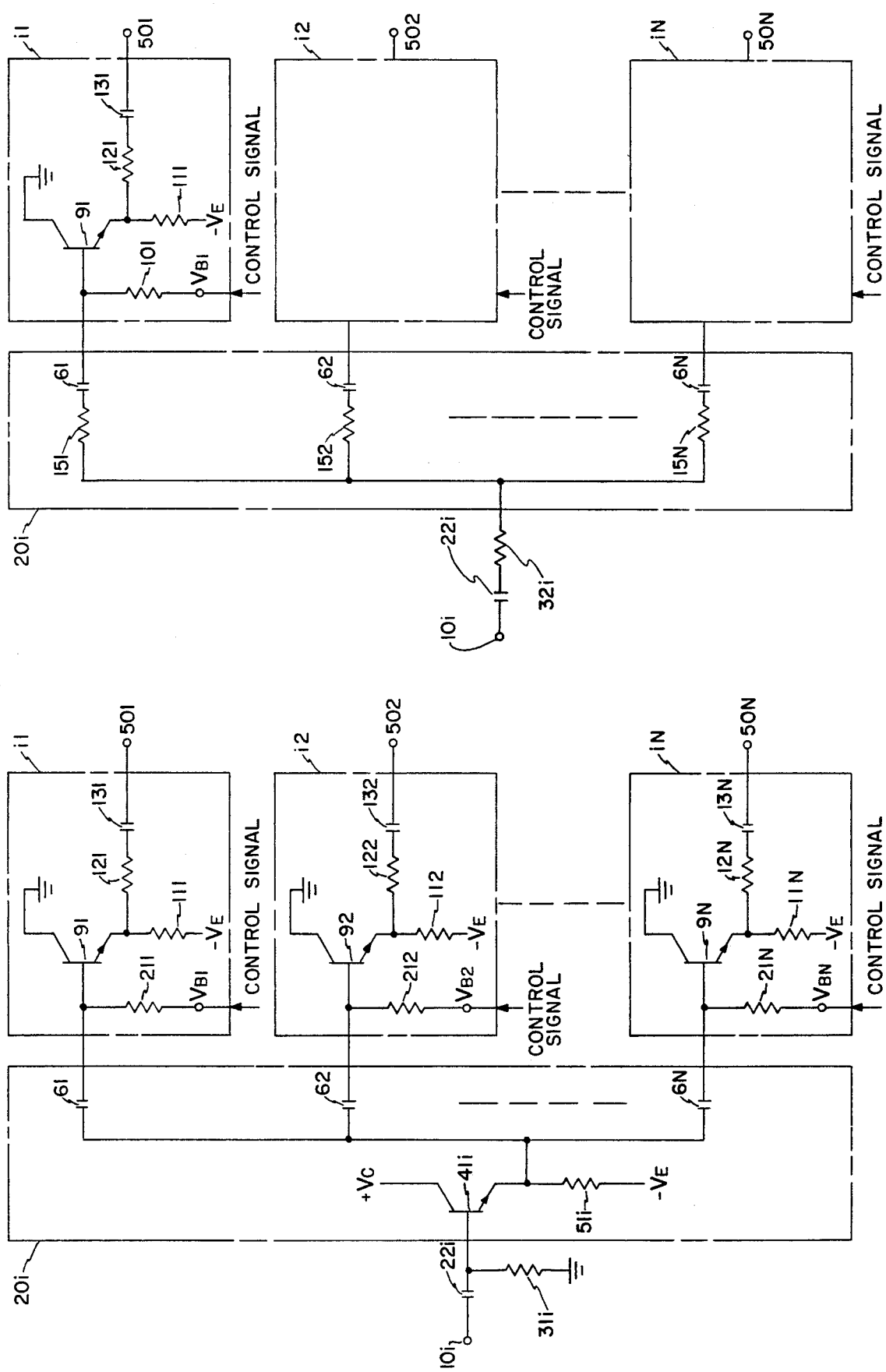
FIGS. 4 and 5 are the schematic circuit diagrams showing respectively embodiments of a distributing circuit and the switching circuit according to the present invention.

FIG. 4 is a schematic circuit diagram showing the distributing and switching circuits embodying the present invention. An emitter follower circuit is used as the distributing and switching circuits. Since the distributing circuit 20$i$ ($i=1, 2, \ldots$ M) comprising the emitter follower circuit has a high input impedance, it is also used as an input buffer circuit. In addition, since the distribution is made at the output of the emitter follower, with a small insertion loss and a low impedance, it is possible to obtain many distribution numbers by using one transistor 41$i$. It is further possible to provide a sufficient isolation among the distributed signals. Therefore, it is possible to distribute the input signal and to combine the distributed signals even without the switching circuit of an impedance matched type.

The signals are distributed into N signal components at the distributing circuit 20$i$ and are respectively applied to emitter follower switching circuits ij (j=1,2,.., N) by way of capacitors 61-6N, respectively. These switching circuits have the same components. The switching circuit i2, for example, whose output is connected to the combining circuit 302, is comprised of an emitter follower circuit with a transistor 92. By controlling the base bias voltage of the transistor 92 via a bias resistor 212, the switching circuit i2 can be turned on or off. That is, when the voltage $V_{B2}$ on the control terminal of the bias resistor 212 is sufficiently higher than the supply voltage $-V_E$ on the emitter of the transistor 92, the transistor 92 turns on and therefore an input signal applied to the base of the transistor 92 is emitted to the emitter of the transistor 92. Whereas, when the control voltage $V_{B2}$ becomes $-V_E$ or less, the transistor 92 turns off and the base input signal does not appear at the emitter.

When the transistor 92 turns on, the current flowing across the transistor 92 is defined by both the control voltage $V_{B2}$ and the resistance of an emitter resistor 112. When the transistor 92 turns off, no current passes to the transistor 92. The output signal of the transistor 92 is applied to the combining circuit 302, via a resistor 122 which provides for impedance matching, a DC blocking capacity 132 and a terminal 502. Depending on the load circuit which is to be connected to the output of the switching circuit i2, the impedance matching resistor 122 is not necessarily required.

According to the embodiment of the present invention shown in FIG. 4, the distributing circuit 20$i$ and the switching circuit ij are connected without matching impedance. However, if a matching loss occurs between these circuits, the impedance may be matched quite easily by inserting a matched resistor serially to the output of the distributing circuit 20$i$. Its resistance cooperates with the resistance of the bias resistor 21$j$ of the switching circuit ij.

As mentioned above, if the distributing circuit 20$i$ is composed of a circuit having a low output impedance, such as an emitter follower circuit, a switch matrix with a small insertion loss, will be obtained by combining circuit 20$i$ with the emitter follower switch circuits (i1-iN). With such a composition, a change of distribution numbers becomes feasible without causing changes in the insertion loss.

FIG. 5 shows an embodiment of the present invention wherein a distributing circuit 20i', comprised of resistances, is coupled to emitter follower switching circuits i1–iN. Although the insertion loss increases due to the resistances in the distributing circuit, the impedance matching is always achieved because the emitter follower switching circuits i1–iN are loaded circuits. The emitter follower switching circuits i1–iN have the same construction as circuit shown in FIG. 4.

In addition to the distributing circuit shown in FIGS. 4 and 5, a hybrid or a coupler can be combined with the switching circuits i1–iN. However, in this instance, the apparatus size becomes larger and the insertion loss increases, while impedance matching is not affected.

Figure 6:
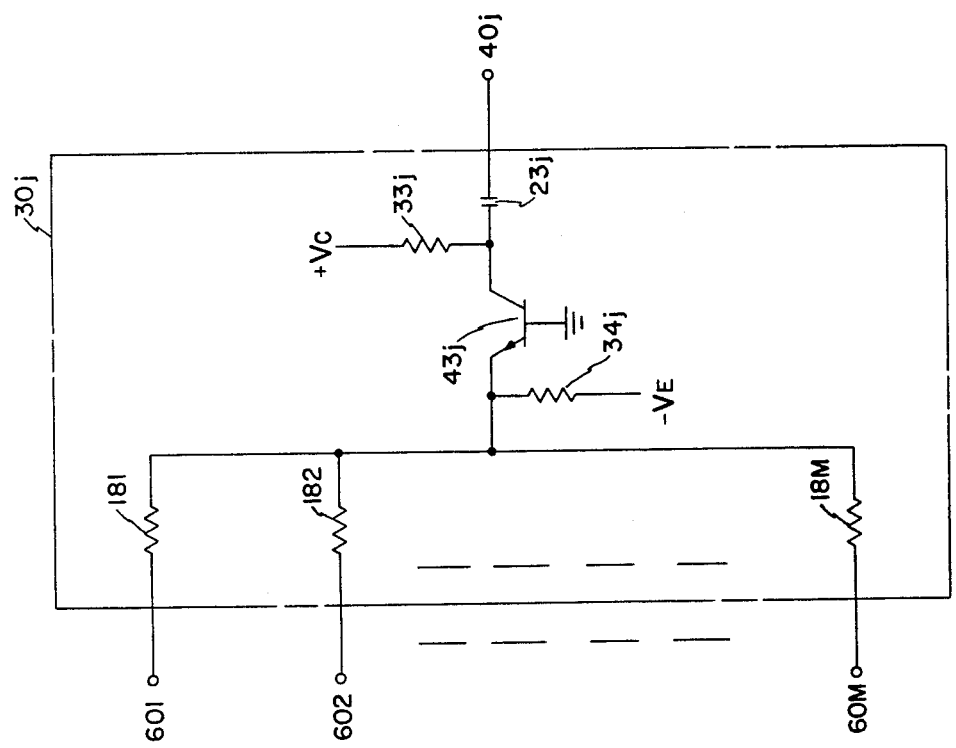

The combining circuit 301–30N (FIG. 3) can be constructed by combining a current combined circuit comprising resistances and a low input impedance circuit. FIG. 6 shows a schematic circuit diagram of such a combining circuit according to the present invention where a grounded-base amplifier circuit is used as the low input impedance circuit. A transistor 43j operates as the grounded-base amplifier circuit, and as a current adder type of the combining circuit because its emitter impedance is sufficiently low. An M number of distribution signal, are applied to terminals 601–60M via combined resistances 181–18M and are mutually added with their current by the transistor 43j, and then the combined signal is emitted from an output terminal 40j.

Figure 7:
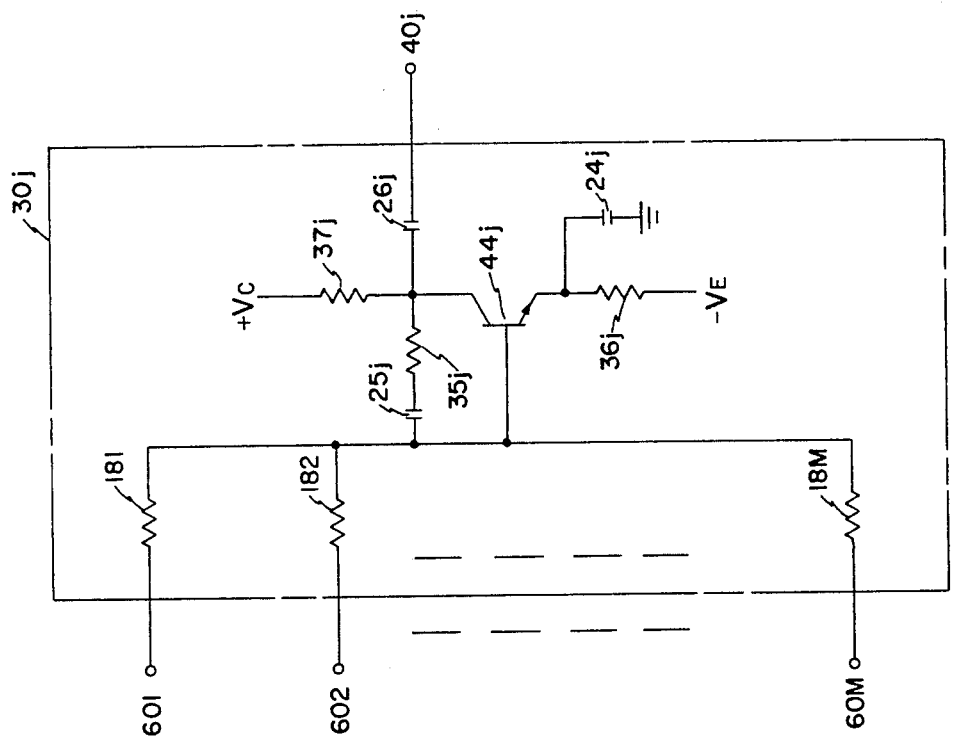
FIGS. 6 and 7 are schematic diagrams showing embodiments of the combining circuit for the switch matrix apparatus according to the present invention.

An embodiment of the present invention shown in FIG. 7 is a combining circuit where the grounded-emitter type of feed-back amplifier circuit is used. An M number of input signals are applied via combined resistances 181–18M and are combined by combined circuit 30j' comprising a transistor 44j.

For any one of the embodiments shown in FIGS. 5, 6 and 7, it is possible to obtain a current adder type of combining circuit by means of a combination of the combined resistances and the low input impedance circuit. Such a combining circuit can expect a high gain, and the number of combinations may be selected arbitrarily. Because of the low input impedance circuit, it is easy to achieve a construction with a well matched impedance. By adjusting the respective values of the combined resistances 181–18M, it is also possible to obtain a switch matrix with only small output level deviations caused by the routing differences. Although an output impedance of a circuit driving the combining circuit must be sufficiently smaller than the combined resistances 181–18M, this condition is met in the embodiments of the present invention since the emitter-follower switch circuit corresponds to such a driving circuit.

As explained heretofore by way of preferred embodiments of the present invention shown in FIGS. 4–7, an M×N crossbar type switch matrix is obtained by connecting M distributing circuits which respectively distribute an input signal to N outlets, M×N switch circuits, and N combining circuits which respectively combine and connect the M input signals to an outlet, as shown in FIG. 3. All kinds of combinations are feasible for the input/output connection mode of the switch matrix, by independently controlling the M×N of control bias voltage $V_{Bj}$ of the switching circuits. Thus, according to the present invention, it is possible to obtain an M×N switch matrix apparatus with a smaller insertion loss, even when the greater number of input/output terminals are involved.

As the number of input/output terminals increases, the distances between these terminals necessarily become greater because of the restrictions imposed on the structure. However, according to the present invention, it is possible to achieve an impedance matching between the distributing circuit and the switching circuit or between the switching circuit and the combining circuit, thereby extending the connection distance.

Figure 8:
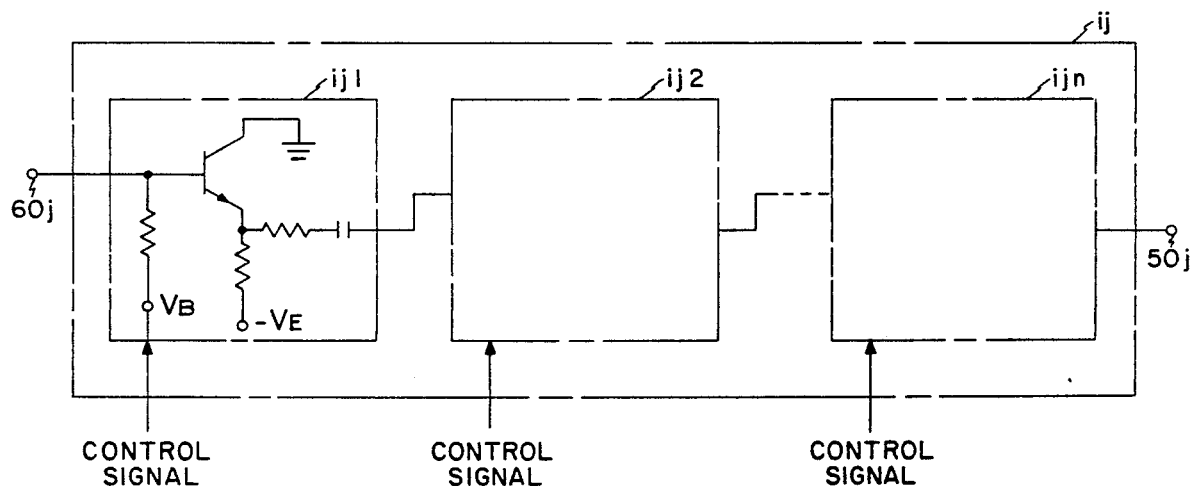
FIG. 8 is a diagram showing the switching circuits, cascade-connected in multiple stages, according to the present invention.

The advantages of controlling the switching circuit are to reduce its driving power consumption caused by the driving voltage and to eliminate the external amplifier usually required for compensating the losses, since the overall insertion loss is small. A compact and light weight switch matrix is another advantage offered by the present invention, since it is possible to use only small sized parts for the switch matrix such as transistors, and capacitors and thus the hybrid-integrated-circuit technology, etc. may be adapted to control the apparatus. Where it is impossible to provide a sufficient isolation as a switch matrix, the switch circuit (ij) may be connected in the multiple cascade connection, as shown in FIG. 8. In this instance, not only is it possible to easily match the impedance between the switching circuit ijk (k=1, 2, ... N, and n is a natural number) and the switching circuit ijk+1, but also the ON/OFF ratio becomes an exponential value of the number of switching stage. In other words, if the switching circuits with 20 dB ON/OFF ratio per 1 stage are cascade-connected in two stages, an ON/OFF ratio of 40 dB and not 26 dB is obtained.

Although the transistor discussed in the foregoing description is an ordinary bipolar transistor, it is a well-known fact that if the FET is used, the emitter corresponds to the source, the base to the gate, and the collector to the drain.

As will be clear from the foregoing description of the present invention, it is possible to obtain a switch matrix wherein the impedance matching among the circuits is easily achieved despite the long connection distances between the circuits. The impedance matching may be unnecessary if the distances are short with small losses caused thereby. It is also possible to obtain a switch matrix having a high speed, compact, light weight and low power consumption characteristics, and a flexibility against the change of impedance caused by variations in the active number of the input/output signals.

The switch matrix apparatus according to the present invention is not to be limited to the use in an SS-TDMA system or a FDMA system, as shown in FIGS. 1 and 2, but it can also be adapted to the switch matrix in relay stations where a plurality of stations carry on the communications with each other, arbitrarily via the relay stations.

What is claimed is:

1. A switch matrix comprising:
   M number (M is a positive integer) of distributing means for distributing an input signal applied thereto into N signals (N is positive integer);
   N combining means for combining the respective distributed outputs of said M distributing means into signals, said N combining means respectively including a current combining means comprising resistances and a low input impedance circuit arranged to be coupled to the output of said current combining means; and
   M×N switching circuit means connected respectively between the outputs of said M distributing means and the inputs of said N combining means for selectively supplying the outputs of said M distributing means to said N combining means, each of said M×N switching circuit means having an emitter follower means with a high input impedance with respect to the impedance of the previous circuit of said M×N switching circuit means and with a low output impedance with respect to the following circuit of said M×N switching circuit means.

2. A switch matrix as claimed in claim 1, wherein said switching circuit means supplies signals from one of said M distributing means to a plurality of said N combining means.

3. A switch matrix as claimed in claim 2, wherein each of said M distributing means comprises one transistor used in an emitter follower circuit configuration as an input buffer circuit, the emitter of said one transistor being coupled through a plurality of parallel capacitors which are individually associated with each of the emitter follower circuits of said M×N switching circuit means, and said switch matrix further comprises means for selectively switching said emitter follower circuits ON and OFF.

4. A switch matrix as claimed in claim 2, wherein each of said M distributing means comprises an input transistor; a plurality of parallel resistors connected to said input resistor; and a plurality of parallel capacitors individually coupled to said plurality of parallel resistors and to a plurality of emitter follower switch circuits, and said switch matrix further comprises means for selectifely switching said emitter follower switch circuits ON and OFF.

5. A switch matrix as claimed in claim 2, wherein said low input impedance circuit comprises a grounded base transistor having an emitter connected to said resistances.

6. A switch matrix as claimed in claim 2, wherein each of said M×N switching circuit means includes a plurality of emitter follower circuits coupled to each other in cascade.

7. A switch matrix as claimed in claim 1, wherein said switching circuit means supplies signals from a plurality of said M distributing means to one of said N combining means.

8. A switch matrix as claimed in claim 7, wherein each of said M distributing means comprises one transistor used in an emitter follower circuit configuration as an input buffer circuit, the emitter of said one transistor being coupled through a plurality of parallel capacitors which are individually associated with each of a plurality of said emitter follower circuit configurations, and said switch matrix further comprises means for selectively switching said emitter follower circuits ON and OFF.

9. A switch matrix as claimed in claim 7, wherein each of said M distributing means comprises an input transistor; a plurality of parallel resistors connected to said input resistor; and a plurality of parallel capacitors individually coupled to said plurality of parallel resistors and to a plurality of emitter follower switch circuits, and said switch matrix further comprises means for selectifely switching said emitter follower switch circuits ON and OFF.

10. A switch matrix as claimed in claim 7, wherein said low input impedance circuit comprises a grounded base transistor having an emitter connected to said resistances.

11. A switch matrix as claimed in claim 7, wherein each of said M×N switching circuit means includes a plurality of emitter follower circuits coupled to each other in cascade.

12. A switch matrix means claimed in claim 1, wherein said switch matrix is on board a space satellite and each input of said M distributing means and each output of said N combining means are respectively coupled to beam antennas through which a plurality of earth stations are coupled to said space satellite.

13. A switch matrix as claimed in claim 12, wherein each of said M distributing means comprises one transistor used in an emitter follower circuit configuration as an input buffer circuit, the emitter of said one transistor being coupled through a plurality of parallel capacitors which are individually associated with each of a plurality of said emitter follower circuit configurations, and said switch matrix further comprises means for selectively switching said emitter follower circuits ON and OFF.

14. A switch matrix as claimed in claim 12, wherein each of said M distributing means comprises an input transistor; a plurality of parallel resistors connected to said input resistor; and a plurality of parallel capacitors individually coupled to said plurality of parallel resistors and to a plurality of emitter follower switch circuits, and said switch matrix further comprises means for selectifely switching said emitter follower switch circuits ON and OFF.

15. A switch matrix as claimed in claim 12, wherein said low input impedance circuit comprises a grounded base transistor having an emitter connected to said resistances.

16. A switch matrix as claimed in claim 12, wherein each of said M×N switching circuit means includes a plurality of emitter follower circuits coupled to each other in cascade.

* * * * *